(12) United States Patent
Zhang et al.

(10) Patent No.: US 8,514,585 B2
(45) Date of Patent: Aug. 20, 2013

(54) ELECTRONIC DEVICE

(75) Inventors: Guang-Yi Zhang, Shenzhen (CN); Zhe Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 411 days.

(21) Appl. No.: 13/037,407

(22) Filed: Mar. 1, 2011

(65) Prior Publication Data
US 2012/0155007 A1   Jun. 21, 2012

(30) Foreign Application Priority Data
Dec. 21, 2010   (CN) .......................... 2010 1 0598896

(51) Int. Cl.
H05K 7/14   (2006.01)

(52) U.S. Cl.
USPC ................. 361/796; 361/679.32; 361/679.55; 361/784; 361/788; 361/801

(58) Field of Classification Search
USPC ................. 361/679.31, 679.32, 679.55, 752, 361/784, 788, 796, 801
See application file for complete search history.

(56) References Cited

U.S. PATENT DOCUMENTS

| | | | | |
|---|---|---|---|---|
| 5,715,146 A | * | 2/1998 | Hoppal | 361/796 |
| 5,943,215 A | * | 8/1999 | Carney et al. | 361/756 |
| 5,963,681 A | * | 10/1999 | Clements | 385/14 |
| 6,349,029 B1 | * | 2/2002 | Leman et al. | 361/679.57 |
| 6,618,260 B2 | * | 9/2003 | Willis et al. | 361/752 |
| 6,663,394 B1 | * | 12/2003 | Chung | 439/564 |
| 7,123,470 B2 | * | 10/2006 | Hsu et al. | 361/679.02 |
| 7,359,216 B2 | * | 4/2008 | Hall | 361/796 |
| 7,375,980 B2 | * | 5/2008 | Peng et al. | 361/801 |
| 7,525,815 B2 | * | 4/2009 | Chen et al. | 361/788 |
| 7,639,507 B2 | * | 12/2009 | Chen et al. | 361/756 |
| 7,746,630 B2 | * | 6/2010 | Tsai et al. | 361/679.32 |
| 7,798,839 B2 | * | 9/2010 | Kitahara | 439/359 |
| 8,174,835 B2 | * | 5/2012 | Kim et al. | 361/737 |
| 8,295,060 B2 | * | 10/2012 | Liu et al. | 361/800 |
| 2004/0240173 A1 | * | 12/2004 | Yi et al. | 361/686 |
| 2005/0001649 A1 | * | 1/2005 | Timmins et al. | 326/30 |
| 2005/0122703 A1 | * | 6/2005 | Fan et al. | 361/801 |
| 2005/0130501 A1 | * | 6/2005 | Timmins et al. | 439/637 |
| 2006/0044767 A1 | * | 3/2006 | Wu et al. | 361/725 |
| 2006/0065721 A1 | * | 3/2006 | Addison et al. | 235/383 |
| 2008/0253076 A1 | * | 10/2008 | Chen | 361/684 |
| 2009/0016037 A1 | * | 1/2009 | Chen et al. | 361/810 |

(Continued)

*Primary Examiner* — Adrian S Wilson
(74) *Attorney, Agent, or Firm* — Altis Law Group, Inc.

(57) ABSTRACT

An electronic device includes a motherboard, a riser card, and a securing structure. The riser card connects to the motherboard, and includes a first surface with a second socket thereon for connecting with an expansion card. The securing structure is for securing the expansion card, and includes a first fixing plate, a second fixing plate, and a fixing member for fixing the expansion card. The first fixing plate is arranged on the first surface of the riser card, and includes a number of first latching portions corresponding to the second socket, the first latching portions are arranged on a line parallel to the second socket. The second fixing plate faces the first surface of the riser card, and includes a second latching portion corresponding to each first latching portion. The fixing member includes a first and second end portion latchable with each first and second latching portion respectively.

20 Claims, 3 Drawing Sheets

(56) References Cited

U.S. PATENT DOCUMENTS

2009/0073645 A1* 3/2009 Tsai et al. .................. 361/679.6
2009/0073666 A1* 3/2009 Tsai et al. .................... 361/740
2009/0129002 A1* 5/2009 Wu et al. .................... 361/679.4
2010/0254096 A1* 10/2010 Kim et al. ..................... 361/737
2010/0315774 A1* 12/2010 Walker et al. ............ 361/679.58
2011/0090635 A1* 4/2011 Liu et al. .................. 361/679.33

* cited by examiner

ELECTRONIC DEVICE

BACKGROUND

1. Technical Field

The present disclosure relates to electronic devices and, particularly, to an electronic device with a securing structure for securing expansion cards.

2. Description of Related Art

At present, some electronic devices, such as computers and servers, usually have a number of expansion cards, such as Peripheral Component Interconnect (PCI) cards, used therein. Typically, an electronic device includes a motherboard, a riser card connected to the motherboard, and a number of expansion cards connected to the riser card. In order that the expansion cards can connect to the riser card stably, a securing structure is usually used for securing the expansion cards. However, a conventional securing structure only can be used for securing expansion cards with certain length, and cannot be used for securing an expansion card with a different length. Therefore, when a user of the electronic device want to change an expansion card in the electronic device for an expansion card with different length, the securing structure also should be changed, this is inconvenient to the user.

What is needed is an electronic device which can ameliorate the problem of the prior art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Embodiments of the present disclosure will now be described in detail below, with reference to the accompanying drawing.

Figure 1:
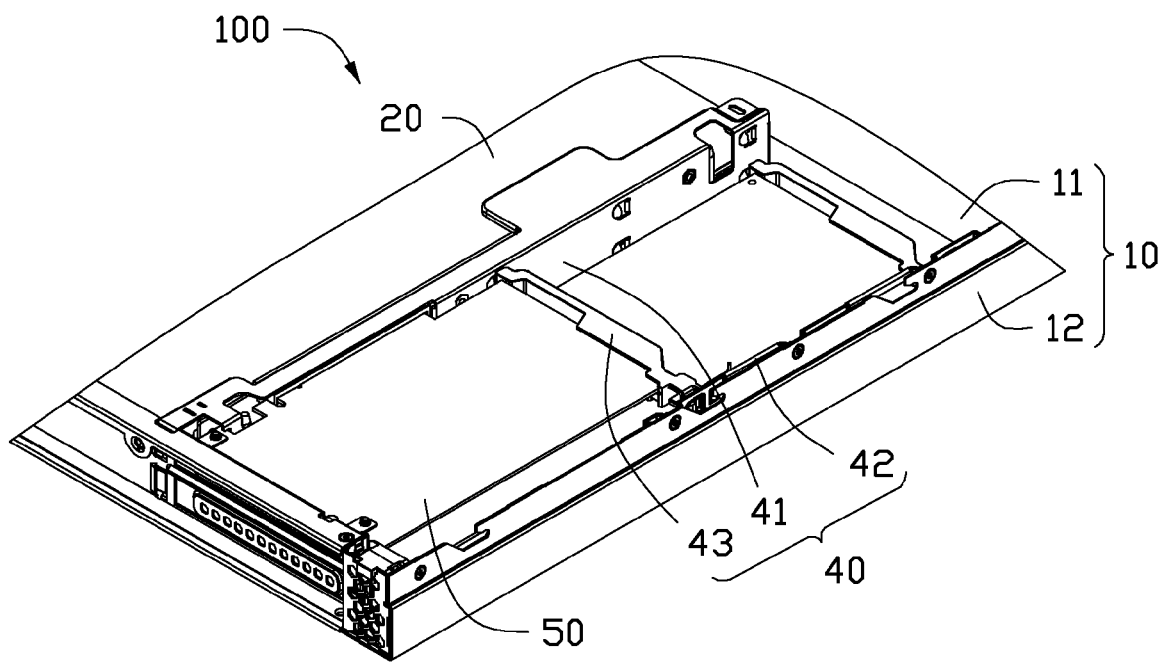
FIG. 1 is a schematic view of an electronic device according to an exemplary embodiment.
Figure 2:
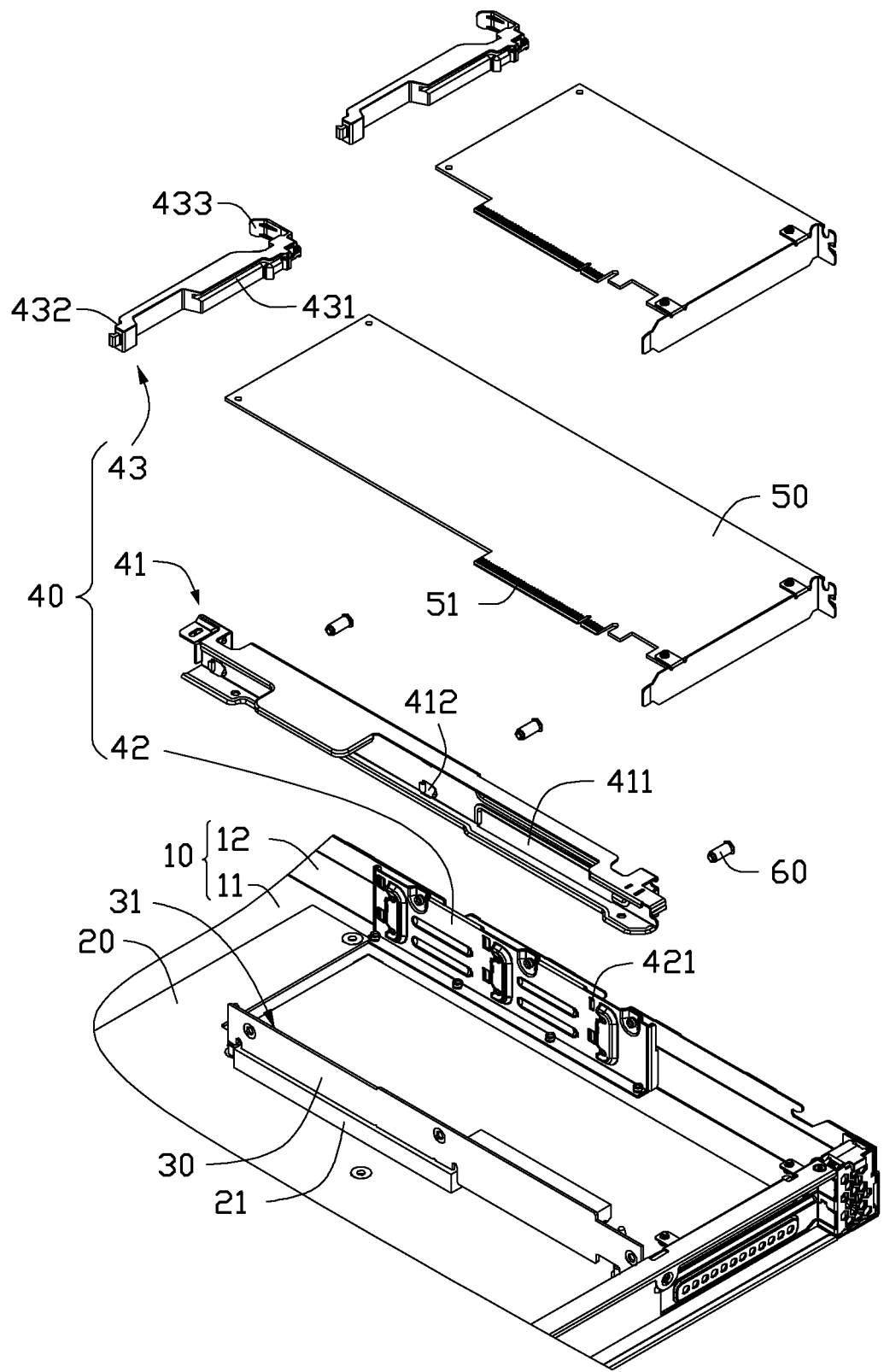
FIG. 2 is a schematic, exploded view of the electronic device of FIG. 1.
Figure 3:
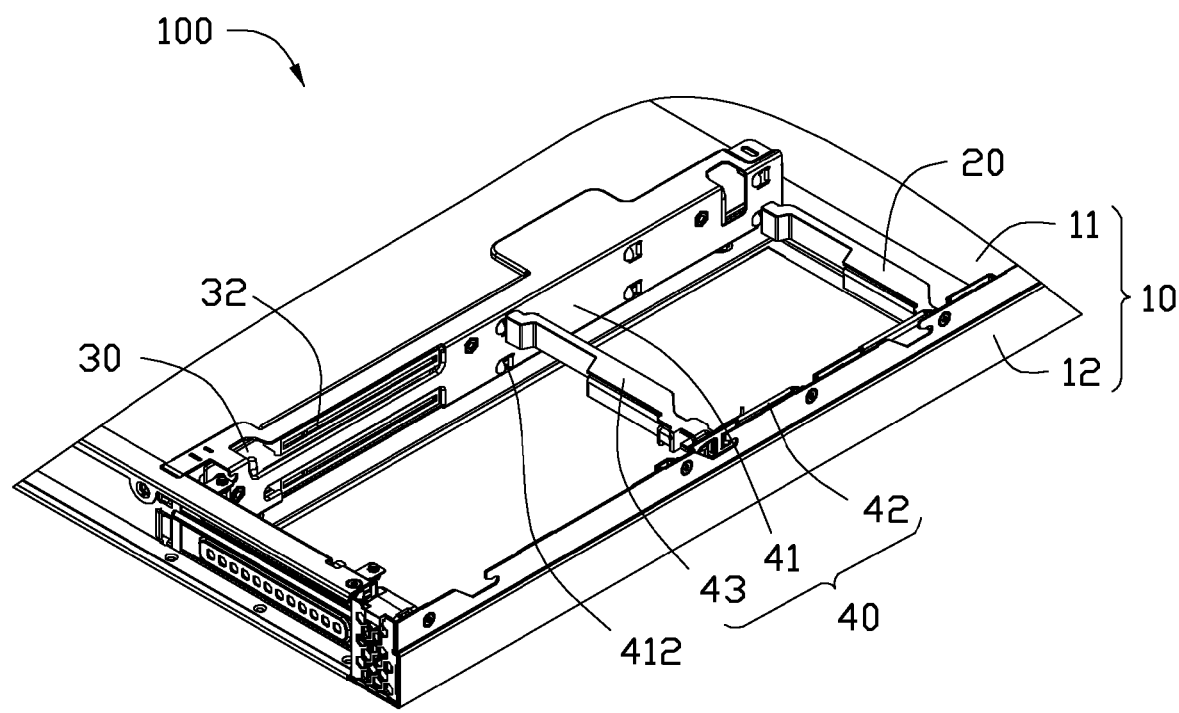
FIG. 3 is a schematic view of the electronic device of FIG. 1 without expansion cards.

Referring to FIGS. 1 to 3, an electronic device 100 according to an exemplary embodiment is shown. The electronic device 100 includes a housing 10, a motherboard 20, a riser card 30, a securing structure 40 and at least one expansion card 50. The electronic device 100 can be a computer or a server. The number of the expansion card(s) 50 in the electronic device 100 can be one, two, three, or more.

The housing 10 includes a bottom plate 11 and a lateral plate 12 connected to the bottom plate 11. In the present embodiment, the lateral plate 12 is substantially perpendicular to the bottom plate 11. The motherboard 20 is fixed to the bottom plate 11. The motherboard 20 is a central printed circuit board (PCB) of the electronic device 100.

The riser card 30 is a plug-in card, and can be plugged into a first socket 21 of the motherboard 20. The riser card 30 is substantially perpendicular to the motherboard 20, and is configured for electrically connecting the motherboard 20 and the expansion cards 50. The riser card 30 includes a first surface 31 facing towards the lateral plate 12, and at least one second socket 32 arranged on the first surface 31. The second socket 32 is used for electrically connecting the expansion card 50. In the present embodiment, the riser card 30 has two second sockets 32. The two second sockets 32 are elongated, and are parallel to each other. The two second sockets 32 are parallel to the motherboard 20. The distances from the two second sockets 32 to the motherboard 20 are different. It is understood that, the number of the second sockets 32 is not limited to the present embodiment, in other embodiments, the number of the second sockets 32 can also be one, three, four or more.

Each expansion card 50 includes an electrical connecting interface 51. The expansion card 50 can be a PCI card, and the electrical connecting interface 51 can be a connecting finger. In the present embodiment, the electronic device 100 includes two expansion cards 50 with different lengths.

The securing structure 40 includes a first fixing plate 41, a second fixing plate 42, and at least one fixing member 43.

The first fixing plate 41 is attached to the first surface 31 of the riser card 30. The first fixing plate 41 can be fixed to the motherboard 20 or fixed to the riser card 30. In the present embodiment, the first fixing plate 41 is fixed to the riser card 30 by a number of screws 60. The first fixing plate 41 defines two openings 411 corresponding to the two second sockets 32. The second sockets 32 of the riser card 30 can be exposed to connect the expansion cards 50. It is understood, the two openings 411 can communicate with each other to form one larger opening, the first fixing plate 41 can also be short enough to not cover the second sockets 32. The first fixing plate 41 includes a number of first latching portions 421 corresponding to each second socket 32, the first latching portions 421 corresponding to one second socket 32 are arranged on a line substantially parallel to the motherboard 20 and the corresponding second socket 32, and are located at a same side of the corresponding second socket 32. In the present embodiment, the distance from the first latching portion 412 to the motherboard 20 is substantially equal to the distance from the corresponding second socket 32 to the motherboard 20.

The second fixing plate 42 faces the first surface 31 of the riser card 30, and is substantially parallel to the first fixing plate 41. The space between the first fixing plate 41 and the second fixing plate 42 is used for receiving the expansion cards 50.

The second fixing plate 42 can be fixed to the motherboard 20 or fixed to the housing 10. In the present embodiment, the second fixing plate 42 is fixed to the lateral plate 12 of the housing 10. The second fixing plate 42 includes a second latching portion 421 corresponding to each first latching portion 412 of the first fixing plate 41. In the present embodiment, the second latching portions 421 are arranged on two rows corresponding to the two second sockets 32 respectively. The second latching portions 421 corresponding to one second socket 32 are arranged on a line substantially parallel to the motherboard 20 and the corresponding socket 32. In the present embodiment, the distance from the second latching portion 421 to the motherboard 20 is substantially equal to the distance from the corresponding second socket 32 to the motherboard 20. In order to decrease the cost of assembling the electronic device 100, the second latching portion 421 can also be integrally formed with the lateral plate 12, that is, the second latching portions 421 are formed on the lateral plate 12, or the second fixing plate 42 is the lateral plate 12.

The fixing member 43 is configured for fixing an end of the expansion card 50, thus, can prevent the expansion card 50 from falling off from the riser card 30. The fixing member 43 is perpendicular to the riser card 30. The fixing member 43 defines a latching slot 431 facing towards the expansion card 50, the latching slot 431 is configured for latching with an end of the expansion card 50. It should be understood, this type of connection between the expansion card 50 and the fixing member 43 is not limited to the present embodiment, in other embodiment, the expansion card 50 can also be fixed to the fixing member 43 by other manners, such as by screws. The fixing member 43 includes a first end portion 432 and a second end portion 433. The first end portion 432 and the second end portion 433 are configured for connecting to the first latching portion 412 of the first fixing plate 41 and the second latching portion 421 of the second fixing plate 42 respectively, thus, the fixing member 43 can be fixed between the first fixing plate 41 and the second fixing plate 42. The distance from the fixing member 43 to the second socket 32 can be changed by changing the connection positions of the first end portion 432 and the second end portion 433, therefore, the securing structure 40 can be used for securing the expansion cards 50 of a number type of lengths.

While certain embodiments have been described and exemplified above, various other embodiments will be apparent to those skilled in the art from the foregoing disclosure. The disclosure is not limited to the particular embodiments described and exemplified, and the embodiments are capable of considerable variation and modification without departure from the scope and spirit of the appended claims.

What is claimed is:

1. An electronic device comprising:
    a motherboard with a first socket;
    a riser card plugged into the first socket of the motherboard, the riser card comprising a first surface with at least one second socket formed thereon for connecting at least one expansion card; and
    a securing structure configured for securing the at least one expansion card, the securing structure comprising:
        a first fixing plate arranged on the first surface of the riser card, the first fixing plate comprising a plurality of first latching portions corresponding to each second socket, the plurality of first latching portions corresponding to one second socket being arranged on a line substantially parallel to the corresponding second socket;
        a second fixing plate arranged facing the first surface of the riser card, the second fixing plate comprising a second latching portion corresponding to each first latching portion of the first fixing plate, the second latching portions corresponding to one second socket being arranged on a line substantially parallel to the corresponding socket; and
        at least one fixing member configured for fixing the at least one expansion card, each fixing member comprising a first end portion latchable with each first latching portion, and a second end portion latchable with each second latching portion.

2. The electronic device as claimed in claim 1, wherein the second socket is elongated, and is parallel to the motherboard.

3. The electronic device as claimed in claim 2, wherein the riser card comprises a plurality of second sockets, and the distances from these second sockets to the motherboard are different.

4. The electronic device as claimed in claim 2, wherein the distance from the first latching portion to the motherboard is substantially equal to the distance from the corresponding second socket to the motherboard.

5. The electronic device as claimed in claim 1, wherein the first latching portions are located at a same side of the corresponding second socket.

6. The electronic device as claimed in claim 2, wherein the distance from the second latching portion to the motherboard is substantially equal to the distance from the corresponding second socket to the motherboard.

7. The electronic device as claimed in claim 1, wherein the fixing member defines a latching slot for latching with an end of the expansion card.

8. The electronic device as claimed in claim 1, wherein the first fixing plate is fixed to the motherboard or fixed to the riser card.

9. The electronic device as claimed in claim 1, wherein the electronic device further comprises a housing, and the housing comprises a bottom plate for fixing the motherboard and a lateral plate substantially perpendicular to the bottom plate.

10. The electronic device as claimed in claim 9, wherein the second fixing plate is fixed to the lateral plate.

11. The electronic device as claimed in claim 10, wherein the second fixing plate is integrally formed with the lateral plate as one monolithic piece.

12. The electronic device as claimed in claim 9, wherein the second fixing plate is the lateral plate.

13. An electronic device comprising:
    a motherboard with a first socket;
    at least one expansion card;
    a riser card plugged into the first socket of the motherboard, the riser card comprising a first surface with at least one second socket formed thereon for connecting with the at least one expansion card; and
    a securing structure configured for securing the at least one expansion card, the securing structure comprising:
        a first fixing plate arranged on the first surface of the riser card, the first fixing plate comprising a plurality of first latching portions corresponding to each second socket, the plurality of first latching portions corresponding to one second socket being arranged on a line substantially parallel to the corresponding second socket;
        a second fixing plate arranged facing the first surface of the riser card, the second fixing plate comprising a second latching portion corresponding to each first latching portion of the first fixing plate, the second latching portions corresponding to one second socket being arranged on a line substantially parallel to the corresponding socket; and
        at least one fixing member configured for fixing the at least one expansion card, each fixing member comprising a first end portion latchable with each first latching portion, and a second end portion latchable with each second latching portion.

14. The electronic device as claimed in claim 13, wherein the second socket is elongated, and is parallel to motherboard.

15. The electronic device as claimed in claim 13, wherein the first latching portions are located at a same side of the corresponding second socket.

16. The electronic device as claimed in claim 13, wherein the first fixing plate is fixed to the motherboard or fixed to the riser card.

17. The electronic device as claimed in claim 13, wherein the electronic device further comprises a housing, the housing comprises a bottom plate for fixing the motherboard and a lateral plate substantially perpendicular to the bottom plate.

18. The electronic device as claimed in claim 17, wherein the second fixing plate is fixed to the lateral plate.

19. The electronic device as claimed in claim 18, wherein the second fixing plate is integrally formed with the lateral plate.

20. The electronic device as claimed in claim 17, wherein the second fixing plate is the lateral plate.

* * * * *